(12) United States Patent
Krümberg et al.

(10) Patent No.: US 10,845,718 B2
(45) Date of Patent: Nov. 24, 2020

(54) HOLDER FOR HOLDING AND FOR PROTECTING A SIDE OF A PHOTOMASK OR A PHOTOMASK OR A PHOTOMASK HAVING PELLICLE FROM A CLEANING MEDIUM, METHOD FOR CLEANING A PHOTOMASK OR A PHOTOMASK WITH PELLICLE AND DEVICE FOR OPENING AND CLOSING A HOLDER

(71) Applicant: SUSS MICROTEC PHOTOMASK EQUIPMENT GMBH & CO. KG, Sternenfels (DE)

(72) Inventors: Jens Krümberg, Germersheim (DE); Adem Beser, Niefern-Oschelbronn (DE); Uwe Dietze, Austin, TX (US)

(73) Assignee: SUSS MICROTEC PHOTOMASK EQUIPMENT GMBH & CO. KG, Sternenfels (DE)

( * ) Notice: Subject to any disclaimer, the term of this patent is extended or adjusted under 35 U.S.C. 154(b) by 0 days.

(21) Appl. No.: 16/348,167

(22) PCT Filed: Nov. 16, 2017

(86) PCT No.: PCT/EP2017/079497
§ 371 (c)(1),
(2) Date: May 8, 2019

(87) PCT Pub. No.: WO2018/091601
PCT Pub. Date: May 24, 2018

(65) Prior Publication Data
US 2019/0369510 A1    Dec. 5, 2019

(30) Foreign Application Priority Data
Nov. 16, 2016 (NL) .................... 2017806

(51) Int. Cl.
G03F 7/20 (2006.01)
G03F 1/66 (2012.01)
G03F 1/82 (2012.01)

(52) U.S. Cl.
CPC .......... G03F 7/70983 (2013.01); G03F 1/66 (2013.01); G03F 1/82 (2013.01); G03F 7/70925 (2013.01)

(58) Field of Classification Search
CPC ...... G03F 1/66; G03F 7/70741; G03F 9/7096; G03F 7/70691; G03F 1/62;
(Continued)

(56) References Cited

U.S. PATENT DOCUMENTS

| 4,648,106 A | 3/1987 | Novak |
| 2017/0139334 A1* | 5/2017 | Rye ..................... G03F 7/70925 |

FOREIGN PATENT DOCUMENTS

| CN | 1980841 | 6/2007 |
| JP | 2004259756 | 9/2004 |
| JP | 2004354656 | 12/2004 |

* cited by examiner

*Primary Examiner* — Mesfin T Asfaw
(74) *Attorney, Agent, or Firm* — Tarolli, Sundheim, Covell & Tummino LLP

(57) ABSTRACT

A holder for receiving and for protecting one side of a photomask or a photomask with pellicle from a cleaning medium, a method for cleaning such a photomask and an apparatus for opening and closing a holder are disclosed. The holder comprises a base having at least three support elements, which are arranged for receiving and for holding the photomask or the photomask with pellicle spaced from the bottom surface of the base, a sealing frame having an upper side and a lower side, wherein the lower side may be seated onto the base, and wherein the sealing frame comprises a centre opening, which is sized such that it may receive the photomask in a spaced manner. A circumferen- (Continued)

tial, elastic sealing element is provided on the sealing frame, which extends from the inner circumference of the centre opening into the centre opening in an inclined manner towards the upper side of the sealing frame, wherein the sealing element in a no load condition has an inner circumference, which is smaller than the outer circumference of the photomask, and in a load condition circumferentially contacts a photomask, which is received in the centre opening, at its side surface.

34 Claims, 12 Drawing Sheets

(58) Field of Classification Search
CPC ............. G03F 7/70733; G03F 7/70925; G03F 7/70983; H01L 21/67359; H01L 21/67778; H01L 21/68707; G02B 6/02209; G02B 6/362; H01J 2237/0456
See application file for complete search history.

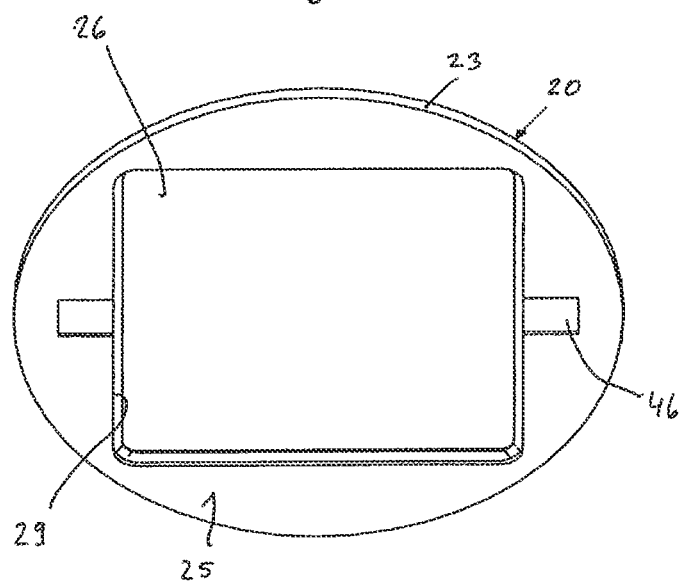
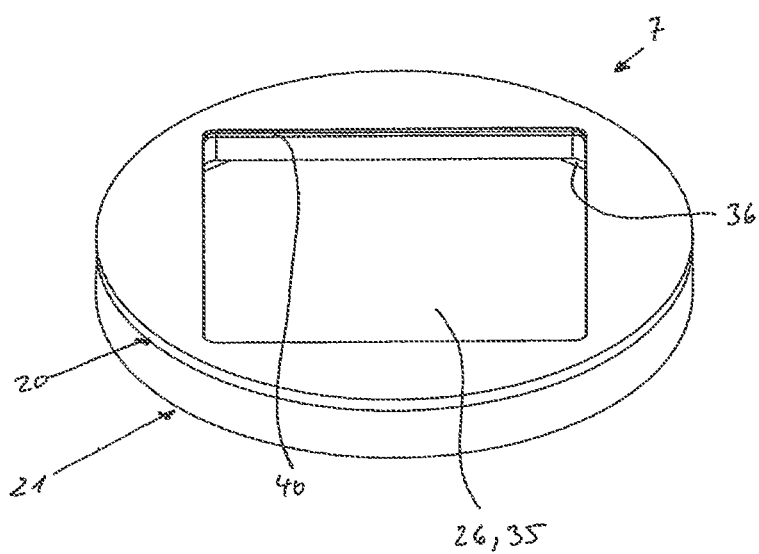

HOLDER FOR HOLDING AND FOR PROTECTING A SIDE OF A PHOTOMASK OR A PHOTOMASK OR A PHOTOMASK HAVING PELLICLE FROM A CLEANING MEDIUM, METHOD FOR CLEANING A PHOTOMASK OR A PHOTOMASK WITH PELLICLE AND DEVICE FOR OPENING AND CLOSING A HOLDER

RELATED APPLICATIONS

This application corresponds to PCT/EP2017/079497, filed Nov. 16, 2017, which claims the benefit of Netherlands Application No. 2017806, filed Nov. 16, 2016, the subject matter of which are incorporated herein by reference in their entirety.

BACKGROUND OF THE INVENTION

The present invention relates to a holder for receiving and for protecting one side of a photomask or of a photomask with pellicle from a cleaning medium, a method for cleaning one side of a photomask or of a photomask with pellicle as well as an apparatus for opening and closing a holder of the above type.

In particular in the field of semiconductor technology, it is known to use photomasks for photolithographic processes. For obtaining good process results, the photomasks have to be cleaned regularly. For protecting certain surfaces of the photomask against contamination by particles, in some cases so-called pellicles are being used.

Pellicles are thin films or membranes, which are held in a spaced manner with respect to the surface of the photomask to be protected by means of for example a frame, which is glued to the side of the photomask to be protected. Particles thus cannot reach the respective surface of the photomask and if any particles are present, they adhere to the pellicle. The pellicle is arranged at a distance which is far enough from the respective mask surface, such that at least particles below a certain size, which adhere to the pellicle are sufficiently far from the respective surface of the photomask that they do not impair the imaging processes.

Hereby, the cleaning cycles for the respective surface may be substantially reduced. However, it is still necessary to clean the side of the photomask being opposite the pellicle. While in the past pellicles and their frames were attached to the side of photomask such that outside of the frame a circumferential edge area of the mask remained free and could be used as a sealing surface, some of today's or future pellicles extend all the way to the edge of the photomask or may even extend beyond the same.

During the cleaning of the side opposite the pellicle, it is required that the side carrying the pellicle is protected from the cleaning media being used. Hereby, damages and/or contaminations of the pellicle, of its frame or of the side of the photomask carrying the pellicle may be avoided. This was typically achieved by setting the circumferential edge area of the side carrying the pellicle onto a sealing frame. The edge area was previously structured such that the pellicle and the side of the mask lying within the edge area was sealed with respect to the atmosphere and in particular with respect to a cleaning medium. With pellicles, which reach all the way to the edge area of the photomask and/or even extend beyond the same, this is no longer possible since not sufficient surface area of the photomask is present on the side of the photomask carrying the pellicle. Further-more, even with photomasks without pellicle it might be advantageous that during the cleaning of the one side, the other is not contacted.

Therefore, there is the need to provide an alternative apparatus and method which are capable of protecting one side of a photomask, in particular a side of the photomask carrying a pellicle with respect to a cleaning medium, while the other side is cleaned with this cleaning medium.

SUMMARY OF THE INVENTION

In accordance with the invention, a holder according to claim 1 and a method according to claim 20 as well as a specific apparatus for opening and closing a holder of the above type according to claim 24 are provided. Further embodiments of the invention are inter alia disclosed in the dependent claims.

In particular, a holder for receiving and for protecting a photomask or a photomask with pellicle from a cleaning medium is provided wherein the holder comprises: a base having at least three support elements, which are arranged for receiving and for holding the photomask or the photomask with pellicle spaced from the bottom surface of the base, a sealing frame having an upper side and a lower side, wherein the lower side may be seated onto the base, and wherein the sealing frame comprises a centre opening, which is sized such that it may receive the photomask in a spaced manner, a circumferential elastic sealing element at the sealing frame, which extends from an inner circumference of the centre opening in an inclined manner towards the upper side of the sealing frame into the centre opening, wherein the sealing element in a no load condition has an inner circumference, which is smaller than the outer circumference of the photomask, and in a load condition may contact a photomask which is received in the centre opening in a circumferential manner at its side surface. Such a holder is suitable for receiving a photomask or also a photomask with pellicle with a downwardly facing pellicle on the base, and to then mount the sealing frame from above and to provide a sealing at the side surface via the specific seal. The sealing frame may be removed in the opposite direction and is thus at no point in time in contact with the side of the photomask facing the base and/or a pellicle at the photomask.

Preferably, the support elements are arranged such that they contact the photomask only at an edge, in particular at the corners of the photomask. The support elements may have one or also two inclined support surfaces.

In accordance with one embodiment, in a no load condition, the seal extends in a uniform manner from the inner circumference of the centre opening into the centre opening and in particular over a distance of 2.5 to 3.5 mm and preferably about 2.9 mm. The distance is measured in the plane of the upper or lower surface. Furthermore, the seal may be sized such that in an no load condition it overlaps an edge area of a photomask, which is centered with respect to the seal by about 0.4 to 1 mm, preferably by 0.6 to 0.8 mm. The respective projection of the seal into the opening provides sufficient material for allowing the seal to deform, when the photomask is received and on the other hand is not too large for the seal to be unstable, when during the cleaning of a photomask, forces act thereon. The overlap again provides for sufficient deformation of the seal and a respective pressing force of the seal against the side surface of the photomask.

Preferably, the seal has a thickness in the range of 1 and 3 mm, preferably in the range of 1.5 to 2.5 mm and a shore hardness A in the range of 25° to 75°. The above measures have been shown to be particularly suitable for seals which are resistant to chemicals such as seals made of FFKM perfluoro-elastomer rubbers or EPDM ethylene-propylene-diene-monomer rubbers, to provide a good sealing against the side surface of the photomask.

In a non mounted and no load condition, the seal may have a substantially flat configuration and may thus be manufactured easily. The seal may, however, also have a tapered section, facing toward the inner circumference. For good sealing against the side surface of a rectangular photomask, the seal has a substantially rectangular inner circumference wherein the corners of the inner circumference are rounded and preferably have a radius in the range of 2 to 4 mm, in particular of about 3 mm.

In one embodiment the seal has a substantially rectangular outer circumference, wherein at least two opposite edge regions may be provided with a mounting lug. Preferably, the material forming the seal is adapted to the specific application, such that the seal is resistant to the used cleaning media and/or UV radiation.

The sealing frame may have an upper part and a lower part, which are attached to, each other in a detachable manner, wherein the seal is clamped between the upper part and the lower part. In so doing, the seal may be mounted to the sealing frame in a reliable manner and may be easily replaced. In particular, the upper part and the lower part may form a circumferential receiving space for the seal, which is open towards the centre opening. The receiving space may taper towards the centre opening and may extend towards the centre opening in an inclined manner towards the upper side of the sealing frame. By means of such a receiving space, the seal may be held in a secure manner and may be brought into the orientation, which is inclined towards the upper side of the sealing frame. Preferably, the receiving space for the seal is inclined by approximately 29° towards the upper side of the sealing frame. Preferably, the receiving space has a height at its end facing the centre opening, which is smaller than the thickness of the seal. In particular, the end of the receiving space, which faces the centre opening has a heights, which is by 10% to 20% smaller than the thickness of the seal, in order to hold the same in a secure manner and to bias the same even further.

For use in wet cleaning, the sealing frame has a slope in an area above the mounting location of the seal, which widens towards the radial circumference of the sealing frame. For a secure holding of the sealing frame to the base during use of the sealing frame, the base may have a holder unit, in particular a vacuum or negative pressure unit, for holding the sealing frame in a releasable manner to the base. In one embodiment, at least one of the base and the sealing frame may have a circumferential seal, which faces towards the other element, i.e. the sealing frame or the base, in order to seal the contact area between the two elements. The base and the sealing frame may have complementary guide elements, which during placement of the sealing frame on the base achieve alignment of the two elements which respect to each other.

The method for cleaning one side of a photomask, in particular of a photomask having a pellicle, comprises the following steps: receiving the photomask in a holder of the above described type, wherein the photomask is initially placed onto the support elements, such that its side not to be cleaned faces the base and thereafter the sealing frame is placed onto the base, such that the elastic seal element contacts the photomask circumferentially at its side surface and seals against the same, wherein the side of the photomask to be cleaned is accessible, cleaning of the side of the photomask to be cleaned with at least one cleaning medium, which is applied to the side to be cleaned, removing the sealing frame from the base in the opposite direction to the placement of the sealing frame on the base, while the photomask is pressed against the support elements, and removing the photomask from the support elements. Such a method enables sealing at the side surface of the photomask and may thus be used for photomasks with and without pellicle in the same manner. By removing the sealing frame in the opposite direction to placing the sealing frame on the base, the seal is spaced from the side of the photomask to be protected or from any pellicle mounted thereon at all times and thus the seal cannot cause damages or contaminations. While pressing the photomask against the support elements during the removal of the sealing frame, it can be avoided that the photomask itself is removed or shifted and thus possibly damaged.

In order to protect the side of the photomask to be protected against any contact, the photomask is preferably placed onto the support elements such that only edges, in particular corners of the photomask contact the support elements.

During placement of the sealing frame onto the base, the sealing element is preferably deformed towards the upper side of the sealing frame, such that the lower side of the sealing element contacts the side surface of the photomask and seals against the same. In so doing good sealing action may be achieved.

In accordance with one embodiment, the cleaning medium is a liquid medium and the cleaned side of the photomask is dried prior to removing the sealing frame from the base. A respective drying may for example be achieved by a fast rotation or spinning of the holder.

An apparatus for opening and closing the above described holder comprises: at least two spaced grippers, which face each other, which grippers are movable between an open position, in which they may freely receive the sealing frame therebetween and a closed position, in which they may grip the sealing frame, a mask retention unit having at least one retention pin, which is spatially arranged between the grippers, such that it is aligned with the centre opening in the sealing frame, when the sealing frame is received between the grippers, and which extends in substance perpendicular to an opening/closing direction of movement of the gripper, wherein the at least one retention pin is mounted to be movable in its direction of extension, a moving unit, which is coupled to both the gripper and the retention unit, in order to move the same conjointly. Such an apparatus is particularly suitable to—during the opening of the holder—remove the sealing frame from the base and to press a photomask received in the sealing frame against support elements of the holder to ensure that during the removal of the sealing frame only the sealing frame and not also the photomask is moved.

Preferably, the at least one retention pin is received within a guide element and is elastically biased out of the guide element via a biasing unit, wherein a movement of the retention pin out of the guide element is limited by means of a stop. A respective mounting and biasing may provide a predetermined force against the photomask when the sealing frame is removed. Alternatively or additionally, the at least one retention pin may also be movable in its direction of extension via a controllable moving mechanism.

In one embodiment, the at least one retention pin is movable from its position between the grippers into a neutral position, in which it cannot perform a retention function. In such a position of the at least one retention pin, the apparatus may also be used for the transport of other elements, such as the photomask itself.

In accordance with one embodiment, the movement unit comprises two spaced arms, which each carry at least one gripper and which at least in the area of the grippers extend substantially parallel in a longitudinal direction thereof. Preferably, the gripper has at least on one of the arms a gripper jaw holder having a gripper jaw, wherein the gripper jaw holder is rotationally supported around a first axis of rotation, which extends in a longitudinal direction of the respective arm, and wherein the gripper jaw is mounted on the respective gripper jaw holder to be rotational about a second axis of rotation, which extends perpendicular to the longitudinal extension of the respective arm. Hereby, the gripper may adjust to a sealing frame of the holder, which is not properly aligned. In particular, the first and second axis of rotation may in substance be arranged perpendicular to each other. The gripper on at least one of the arms may have a gripper jaw holder having two gripper jaws, which are spaced in a longitudinal direction of the arm supporting the gripper jaw holder, wherein the gripper jaws in a home position are aligned on a line which is substantially parallel to the arm and wherein the gripper jaw holder is supported to be rotational around a third axis of rotation, which is perpendicular to the longitudinal direction of the respective arm. Hereby, the third axis of rotation may point towards the other arm. Preferably, a biasing unit may be provided which biases the gripper jaw holder to its home position.

BRIEF DESCRIPTION OF THE DRAWINGS

The present invention will be described in more detail with reference to the drawings. In the drawings:

FIG. 2 is a schematic sectional view through the holder along line II-II in

FIG. 1;

FIG. 6 is a schematic perspective bottom view of an upper part of the sealing frame of the holder according to FIG. 1;

FIG. 7 is a schematic perspective top view of the sealing frame of the holder according to FIG. 1;

FIG. 17 is a schematic right side view according to FIG. 15, wherein FIGS. 17a and 17b show different position of a gripping jaw holder;

FIG. 19 is an enlarged schematic front view of a partial area of the apparatus according to FIG. 1, wherein FIGS. 19a and 19b show different positions of a gripper jaw holder and a respective gripper.

DESCRIPTION

Figure 1:
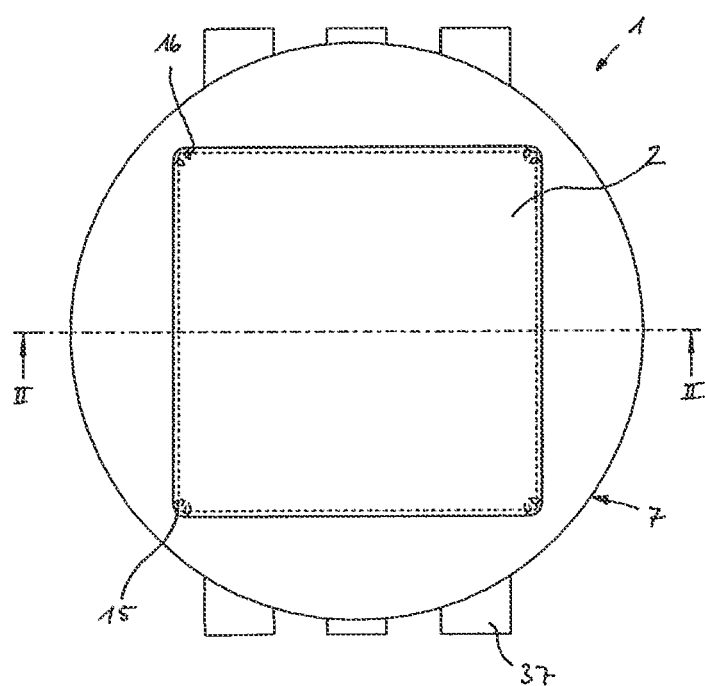
FIG. 1 is a schematic top view of a holder according to the present invention without a seal.

In the following description, directional indications such as top, bottom, left, right, horizontal, vertical as well as their derivatives refer to the representation in the drawings and are not to be seen in an limiting manner, even though they may refer to preferred orientations.

Figure 2:
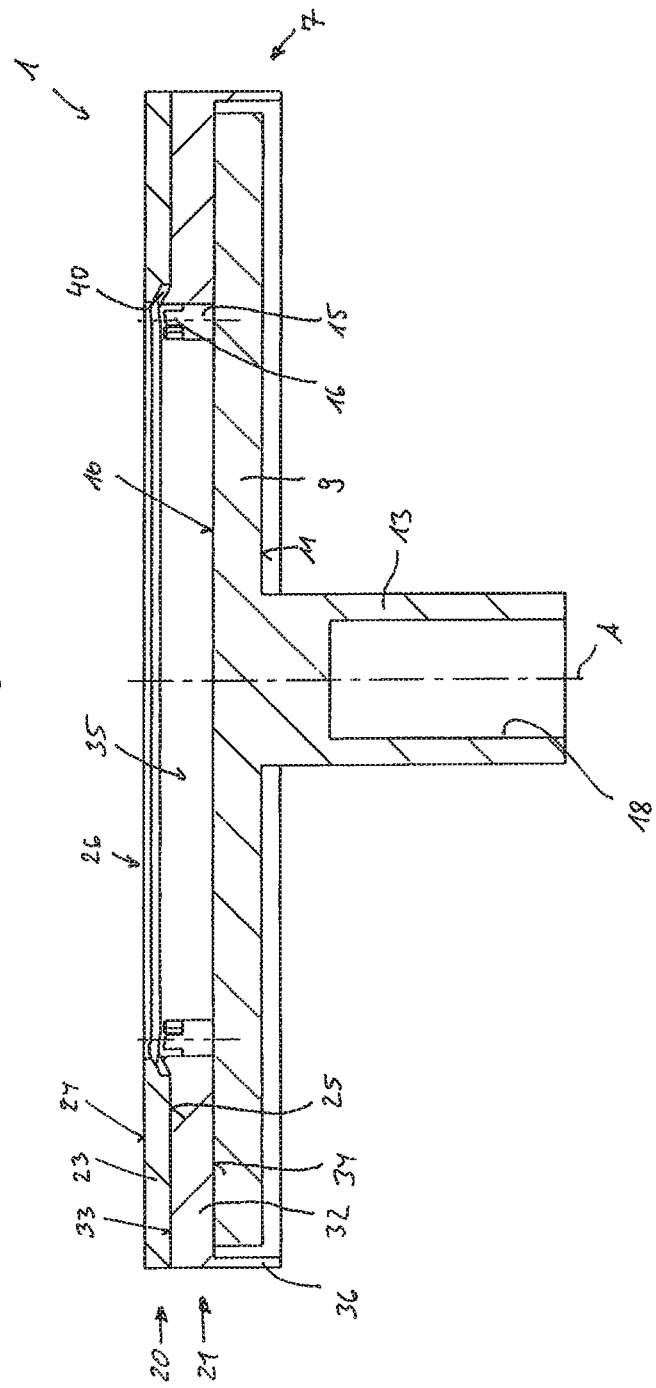
Figure 3:
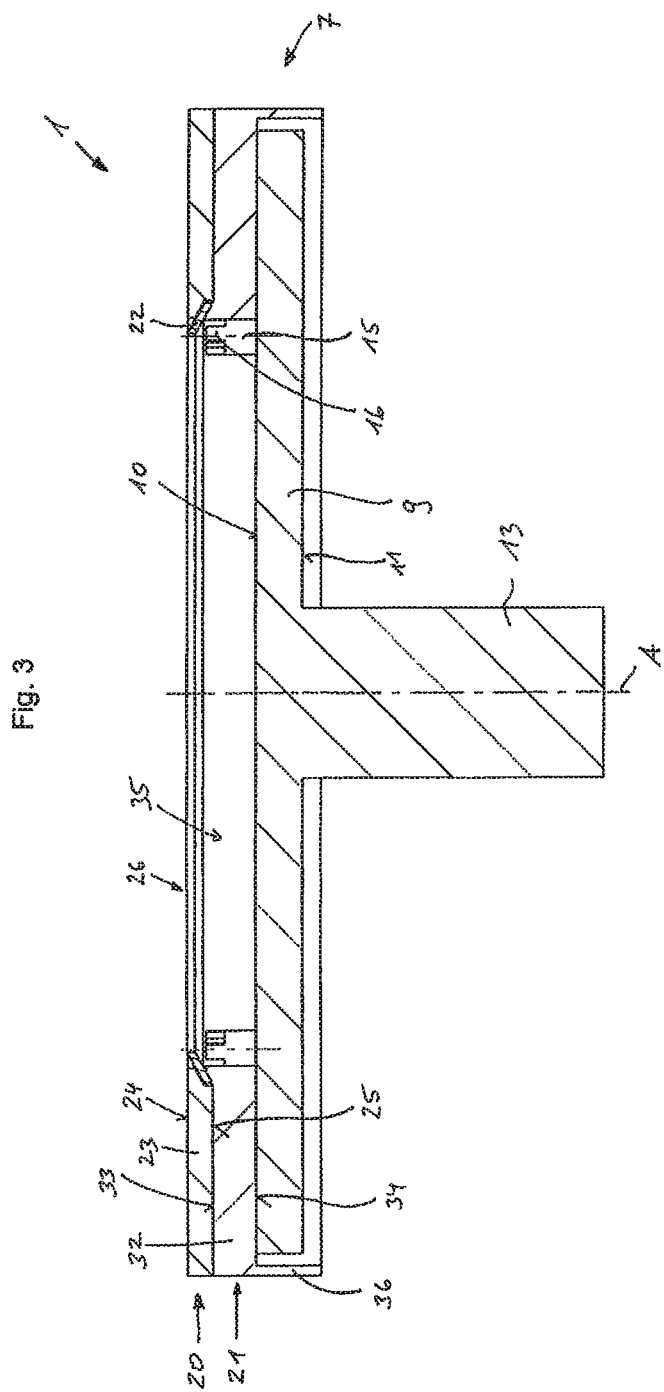
FIG. 3 is a schematic sectional view through the holder similar to FIG. 2, however, having a seal mounted therein.

FIG. 1 shows a schematic top view of a holder 1 for receiving and protecting one side of a photomask 2 or a photomask having a pellicle from a cleaning medium during a cleaning of the other side, i.e. the side of the photomask 2 not to be protected. The photomask 2 is shown in FIG. 1 with a dashed line only and may be a photomask without pellicle or a photomask with pellicle. In the presentation according to FIG. 1 no seal is shown for simplifying the presentation. FIG. 2 shows a schematic sectional view through the holder 1 according to FIG. 1 and FIG. 3 shows a respective sectional view according to FIG. 2 having a seal mounted therein. When the term photomask is used, this should generally relate to the base body of the photomask independent of whether the photomask as such is one with or without a pellicle.

The holder 1 has a base 5 and a sealing frame 7 to be placed onto the base 5. At least one of the base 5 and the sealing frame 7 may be provided with a holding unit, in order to hold the two elements together in a detachable manner when they are seated on each other. In particular, a negative pressure or vacuum unit may be provided, which may for example act via (not shown openings) in the base 5 onto a lower side of the sealing frame, in order to hold the same onto the base. However, other holding units may be provided in order to detachably hold these two elements together.

Figure 4:
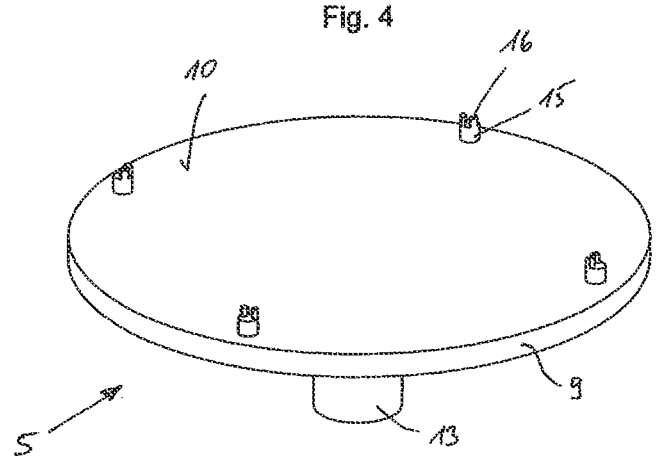
FIG. 4 is a schematic perspective view of a base of the holder according to FIG. 1.

The base 5 in substance consists of a circular plate element 9 having an upper side 10 and a lower side 11 as well as a shank portion 13, which extends perpendicular from the lower side 11 of the plate element 9. The upper side 10 and the lower side 11 of the plate element 9 are substantially planar. As is best shown in the schematic perspective view of FIG. 4, four support elements 15 are provided on the upper side 10 on the plate element 9. The four support elements 15 are arranged such that they may receive a rectangular, in particular a square photomask 2 at its four corners. The support elements each comprise two separate supports 16, which are suitable to contact the photomask 2 at the area of the respective corners at two different longitudinal edges.

Even though the representation shows four support elements 15 having the specific configuration of each having two support surfaces, the skilled person will realize that a lower number of support elements, in particular three support elements would be sufficient, to define a support plane, wherein each of the support elements may have only a single support surface. The support elements 15 are sized and arranged such that a photomask 2 received thereon is substantially parallel to the upper side 10 of the base. For a photomask having a pellicle, the support elements 15 have a sufficient heights such that a photomask with a downwardly facing pellicle may be received on the support elements 15 such that the pellicle is spaced from the upper side 15 of the base 5. Furthermore, the support elements 15 are arranged such that when a photomask 2 with a downwardly facing pellicle is received on the support elements 15, the support elements 15 do not contact the pellicle and its frame. In particular, the support elements 15 are configured such that they contact the photomask only at their downwardly facing edges. For this purpose, the support surfaces 16 each comprise inclined top surfaces.

The shank portion 13 is centered with respect to the plate portion 9 and is in substance round. As is shown in the presentation of FIG. 2, the shank portion 13 may be at least partially hollow and may comprise a receiving space 18 for the shaft of a rotational drive (not shown). Alternatively, the shank portion 13 may also be formed as a solid portion as indicated in FIG. 3 and other suitable structures for connecting the same to a shaft of a rotational drive may be provided. In use, the base 5 is typically rotationally supported via a respective shaft of a rotational drive, wherein the axis A indicated in FIGS. 2 and 3 represent an axis of rotation.

The sealing frame 7 of the holder 1 in substance has an upper portion 20, a lower portion 21 and a seal 22. For easier representation, the seal is not shown in FIGS. 1 and 2, but is shown in FIG. 3. For forming the sealing frame 7, the upper part 20 and the lower part 21 are detachably attached to each other via suitable mounting means, such as screws, which allow non-destructive detachment of the elements, in such manner that the seal 22 is received therebetween as will be described in more detail herein below.

Figure 8:
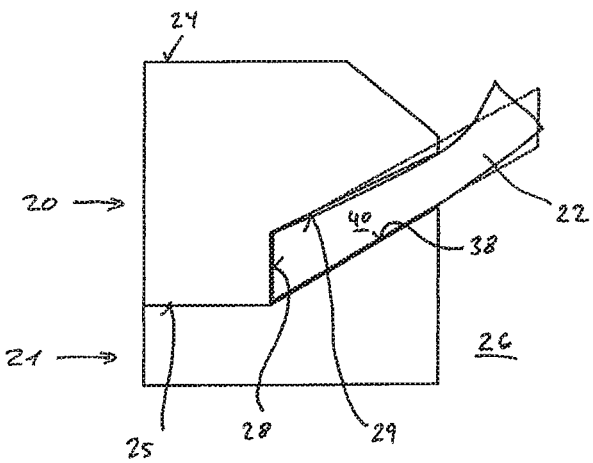
FIG. 8 is an enlarged schematic representation of a clamping area between the upper part and the lower part of the sealing frame having a mounted seal.
Figure 9:
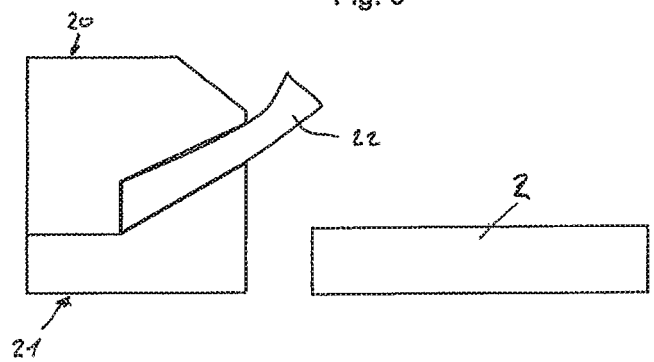
FIG. 9 is an enlarged schematic representation of a clamping area similar to FIG. 8 indicating a photomask in a condition where it is not received in the sealing frame.
Figure 10:
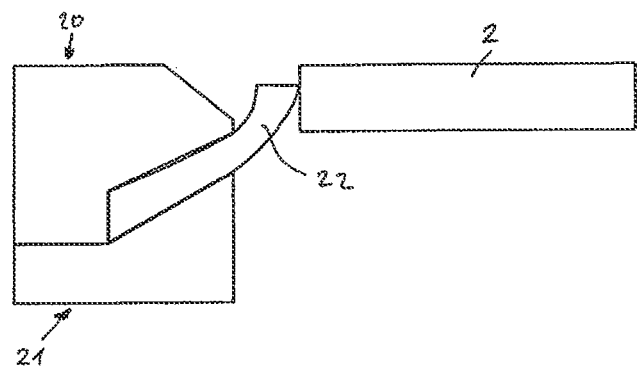
FIG. 10 is an enlarged schematic representation similar to FIG. 9 showing the indicated photomask in a condition where it is received in the sealing frame.

The upper part 20 of the sealing frame is shown in a perspective view from below in FIG. 6 and together with the lower part 21 in a perspective view from above in FIG. 7. The upper part 20 in substance comprises a round plate element having an upper side 24, a lower side 25 and a centre opening 26, which extends between the upper side 24 and the lower side 25. The upper side 24 of the upper part 20 is substantially planar but may have a chamfer adjacent to the centre opening, which is inclined towards the lower side, as shown in FIGS. 8 to 10, or may also have rounded edges.

The lower side 25 may also be substantially planar but guide structures may be provided at the lower side, which allow alignment with respect to the lower part 21, when the upper part 20 and the lower part 21 are assembled. Furthermore, in the lower side 25 of the upper part 20, a plurality of threaded blind bores may be provided, which may for example enable that the upper part 20 and the lower part 21 are attached to each other via suitable screws. However, also other means of mounting the upper part 20 to the lower part 21 are possible, which allow a non-destructive detachment of the two parts.

Adjacent to the centre opening 26, the lower side 25 of the upper part 20 is contoured such that first a shoulder 28 is formed, which extends perpendicular to the lower side 25 and which extends towards the upper side 24. The shoulder 28 is best shown in the simplified representation of FIG. 8, which shows an enlarged schematic presentation of a seal-clamping area between the upper part 20 and the lower part 21 of the sealing frame 7, having a seal mounted therein. The shoulder 28 merges into a slope 29 which extends from an upper edge of the shoulder 28 towards the centre opening 26 and which is inclined towards the upper side 24. In particular, the surface or slope 29 may be inclined by approximately 25 to 32 degrees towards the upper side 24 and for example has an inclination of approximately 28.5 degrees with respect to the upper side 24 of the upper part 20.

The centre opening 26 has a rectangular shape and in particular a square shape having rounded corners and is furthermore sized to receive a photomask 2 in a spaced manner.

Figure 5:
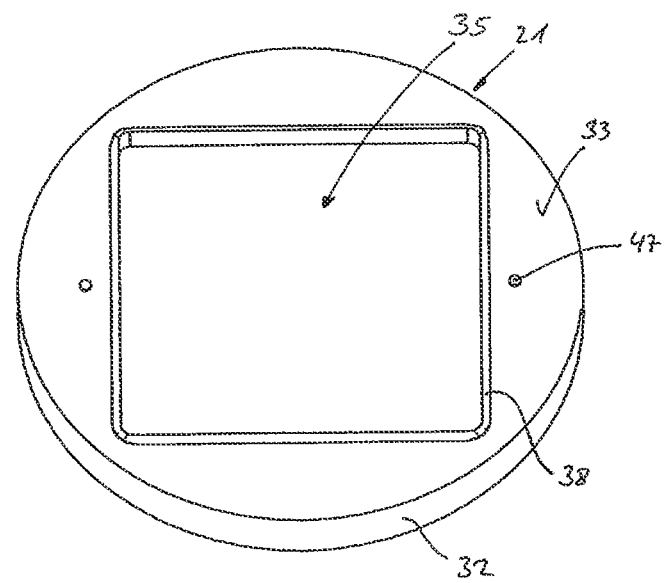
FIG. 5 is a schematic perspective top view of a lower part of the sealing frame of the holder according to FIG. 1.

The lower part 21 again substantially comprises a plate element 32 having an upper side 33, a lower side 34, a centre opening 35 and an outer circumferential skirt 36. A schematic perspective top view of the lower part 21 is shown in FIG. 5. The plate element 32 of the lower part 21 has substantially the same circumferential dimensions as the plate element 23 of the upper part 20. The centre opening 35 in the lower part 21 is in substance of the same shape and size as the centre opening 26 in the upper part 20. When the upper part 20 and the lower part 21 are mounted to each other, the centre openings 26 and 35 are aligned with respect to each other. Even though not shown in FIGS. 5 and 7, handles 37 may be attached to the lower part 21 or may be integrally formed therewith. The handles 37, which may work together with respective grippers, as will be explained in more detail hereinbelow, are only shown in the top view according to FIG. 1. Rather than providing handles 37 at the lower part 21 or additionally thereto, handles 37 may also be provided on the upper part 20 of the sealing frame 7. As shown in the top view, altogether six handles 37 are provided. The handles 37 are divided into groups of three handles 37 each, which are arranged on opposite sides of the sealing frame in a symmetrical manner with respect to the sectional plane II-II in FIG. 1. As the skilled person will realize, also a different arrangement of handles 37 which is different to the shown arrangement may be provided. For working together with a device for opening and closing the holder, which will be described hereinbelow with reference to FIGS. 15 to 18, for example, three of the handles 37 may be sufficient, in particular the outer handles 37 on one side in combination with the middle handle 37 on the other side. By having the arrangement of six handles it is possible to receive the sealing frame even if it is rotated by 180°.

The upper side 33 and the lower side 34 of the plate element are in large areas planar, but the upper side may comprise guide structures, in order to provide alignment between the upper part 20 and the lower part 21 when joining the same. Furthermore, in the plate element 32, bores or passages (not shown) may be provided which may be aligned with corresponding blind bores in the upper part 20, in order to allow the two elements to be mounted to each other by, for example, screws. Respective bores and connectors are not shown in the drawings for simplification of the presentation.

The upper side 33 comprises a projection adjacent to the centre opening 26, which is formed by a slope 38. The slope 38 extends in the radial direction of the lower part 21 over in substance the same distance as the slope 29 extends in the plate element 23 of the upper part 20. The slope 38 is for example inclined with respect to the planar upper side 33 of the plate element 32 in a range between 28° and 34° and for example has an inclination of approximately 30°. The angle between the slopes 29 and 38 is different and, in particular, the angle of the slope 38 is by about 1-2° steeper than the angle of the slope 29. Hereby, in the joint state of the sealing frame 7, a receiving space 40, which tapers towards the centre opening 26, is formed between the upper part 20 and the lower part 21. This tapering receiving space 40 is particularly well shown in FIG. 8, in which also a seal 22 received therein is indicated. The role of the tapering receiving space 40 will be described hereinbelow in more detail, when the seal 22 is described in more detail.

In the respective rounded corners, the slopes 29 and 38 may be somewhat steeper, for example by 0.5° steeper, in order to also provide a good upwards biasing of the corners of the seal 22. Hereby, the opening of the receiving space 40 towards the centre opening 26 is slightly higher in the rounded corners than in the other areas.

The plate element 32 furthermore comprises an outer circumferential skirt 36, which extends in substance perpendicularly downward from the lower side 34, as is shown in FIG. 2 or also in FIG. 3. As may be recognized from FIG. 2, the skirt 36 has inner dimensions, which are suitable for completely receiving the plate portion 9 of the base 5, when the sealing frame 7 is seated on the base 5. Even though not shown in detail, at least one seal may be provided between the lower side 34 of the lower part 21 and the upper side of the plate element 9, which seal may be mounted to one of the two elements.

The seal 22, which is first shown in FIG. 3, will be described hereinbelow with reference to FIGS. 3 and 8 to 14. Herein, FIG. 14 shows a top view of an exemplary seal 22, while FIGS. 8 to 13 schematically show clamping of the seal 22 between the upper part 20 and the lower part 21 of the sealing frame as well as the relationship of the seal 22 with respect to a photomask.

Figure 14:
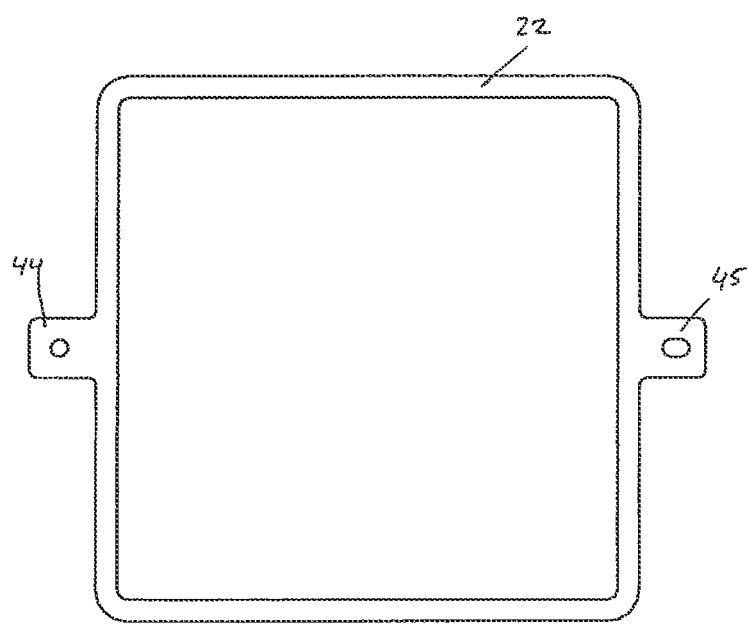
FIG. 14 is a schematic top view of an exemplary seal, which may be mounted to the holder according to FIG. 1.

As may be recognized from the top view according to FIG. 14, the seal 22 has a substantially rectangular, in particular a substantially square, annular shape having rounded corners. At two opposite longitudinal sides of the angular shape, outwardly facing mounting lugs 44, 45 are provided.

In the non-mounted state, the seal 22 has a substantially planar configuration and consists of a suitable sealing material, which is resistant with respect to the cleaning media which are used during the cleaning of the photomask 2. Suitable materials are, for example, FFKM perfluoroelastomer rubber or EPDM ethylene-propylene-diene-monomer rubber. The seal 22 preferably has a thickness in the range of 1 to 3 mm, preferably in the range of 1.5 to 2.5 mm and has a Shore hardness A in the range of 25° to 75°. The substantially rectangular inner circumference of the seal has rounded corners, wherein the radius of the rounded corners is preferably in the range of 2 to 4 mm in particular about approximately 3 mm. Although not shown in the drawings, the seal may have a middle section, which tapers towards the middle opening.

The mounting lugs 44, 45 are sized such that they fit into respective receptacles in the lower side 25 of the plate element 23 of the upper part 20 of the sealing frame 7, which receptacles are shown at 46 in FIG. 6. The mounting lugs 44, 45 each comprise mounting openings, in order to mount the seal 22 to the lower part 21 of the sealing frame 7 in a suitable manner such as via pins 47, which are provided on the upper side 33 of the plate element 32 (see FIG. 5). Obviously, additional mounting lugs may be provided or the mounting lugs 44, 45 may be dispensed with.

As best shown in FIG. 8, the seal 22 has a thickness corresponding in substance to the height of the shoulder 28 at the lower side 25 of upper part 20 of the sealing frame 7. By means of the slope 38 at the lower part 21 of the sealing frame 7, the seal will be inclined in an upward direction as shown in FIG. 8. Here, the dashed shape of the seal 22 in FIG. 8 shows the seal in a condition in which it would be held by the lower part 21 only or in a condition where the receiving space 40 does not taper. The shape in solid lines shows the seal 22 when the upper part 20 is mounted to the lower part 21. Due to the tapering shape of the receiving space 40, adjacent to the centre opening 26 the receiving space 40 has a height which is smaller than the height which the seal 22 would have in a no load condition. Hereby, the seal 22 will be squeezed in this area, which on one hand fixes the seal and on the other hand also provides a further biasing upwards. In particular, the height of the receiving space 40 at its end adjacent the centre opening 26 is by 10% to 20% smaller than the thickness of the seal in a no load condition.

Figure 11:
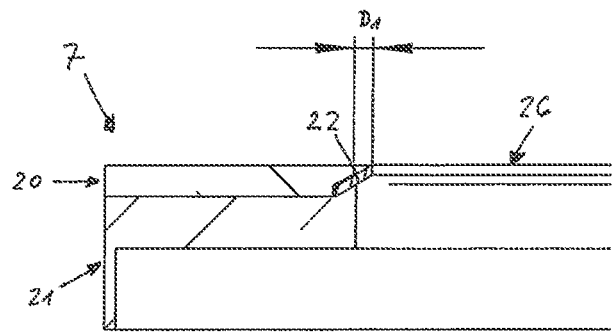
FIG. 11 a further schematic detailed view of the receiving section of a seal in the sealing frame.
Figure 12:
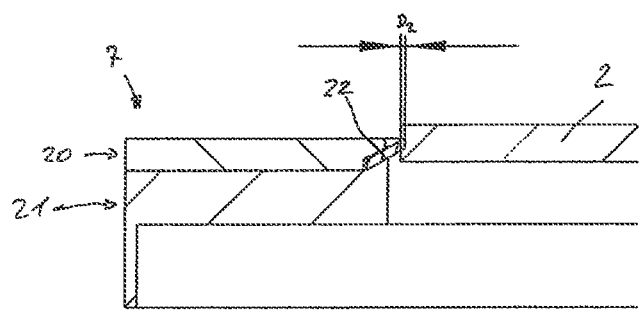
FIG. 12 a representation similar to FIG. 11, which shows the relationship with respect to a photomask.
Figure 13:
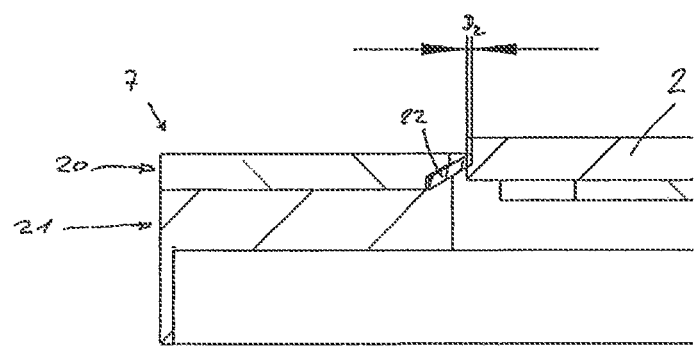
FIG. 13 a representation similar to FIG. 12, which shows the relationship with respect to a photomask having a pellicle.

The seal 22 is sized such that in a mounted condition i.e. when received between the upper part 20 and the lower part 21, it extends substantially equally or homogeneously from the inner circumference of the centre opening 26 into the same over a distance D1 of 2.5 mm to 3.5 mm and preferably over a distance of approximately 2.9 mm in a radial direction of the upper or lower part 20, 21, as for example shown in FIG. 11. Furthermore, the seal 22 is sized such that in an unloaded mounting condition, the edge areas of a photomask, which are centered with respect to the seal, overlap the same over a distance D2 of approximately 0.4 to 1 mm, preferably 0.6 to 0.8 mm in a radial direction, as best shown in FIGS. 13 and 14, independent of whether the photomask 2 is a photomask without pellicle or a photomask with pellicle, as shown in FIGS. 12 and 13.

When a photomask 2 is received in the centre opening 26 of the sealing frame 7 such that the photomask contacts the seal 22 from below, the seal is further deformed upwards, as schematically shown in FIG. 10. The seal 22 contacts the photomask at its side surface and seals against the same. A corresponding sealing is facilitated by the specific shape of the seal 22, which it takes, when it is clamped between the upper part 20 and the lower part 21 of the sealing frame 7. The sealing is then effected via the lower side of the seal 22 as shown in FIG. 10. Due to the inclined arrangement of the seal 22, a good contact between the lower side of the seal 22 with the circumferential side surface of the photomask 2 is facilitated. The inclined arrangement furthermore facilitates that the sealing frame 7 may be easily set from above onto the photomask 2 and may be removed therefrom in an opposite direction, as will be explained hereinbelow in more detail.

Figure 15:
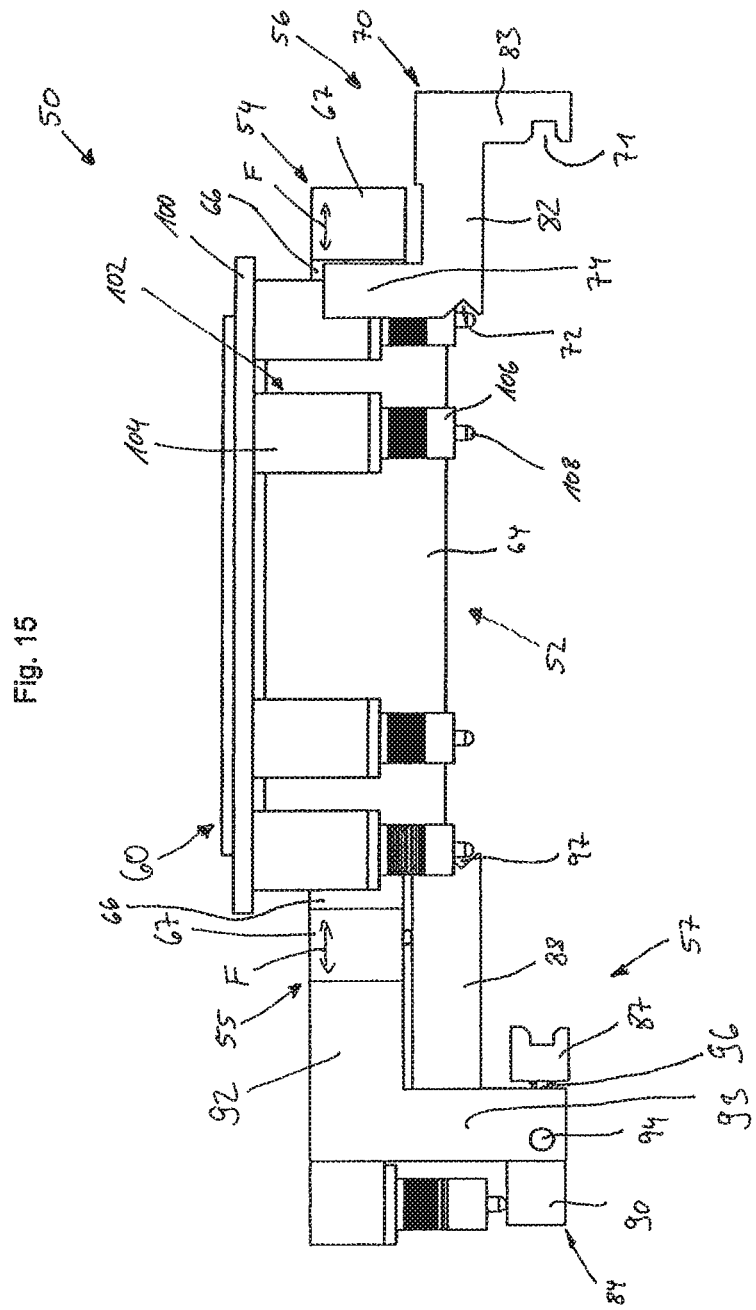
FIG. 15 is a schematic front view of an apparatus for opening and closing a holder according to FIG. 1.
Figure 16:
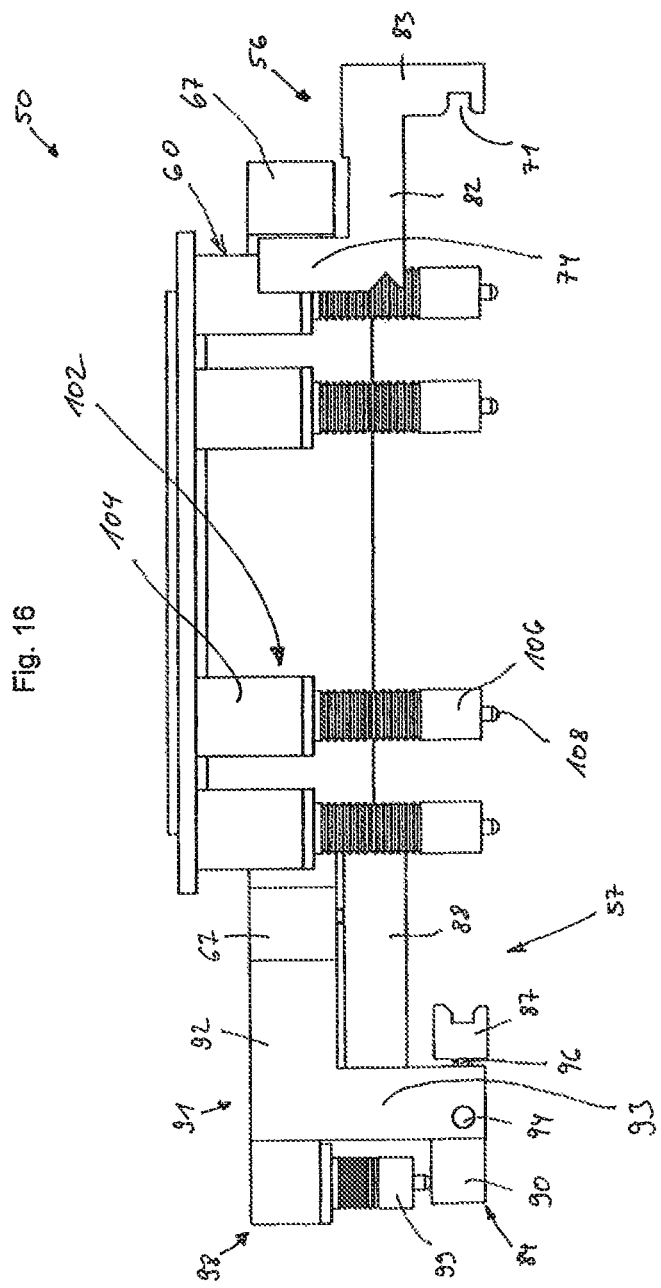
FIG. 16 is a schematic front view of the apparatus according to FIG. 15, wherein retention arrangements of the apparatus are shown in a different position to FIG. 15.
Figure 17:
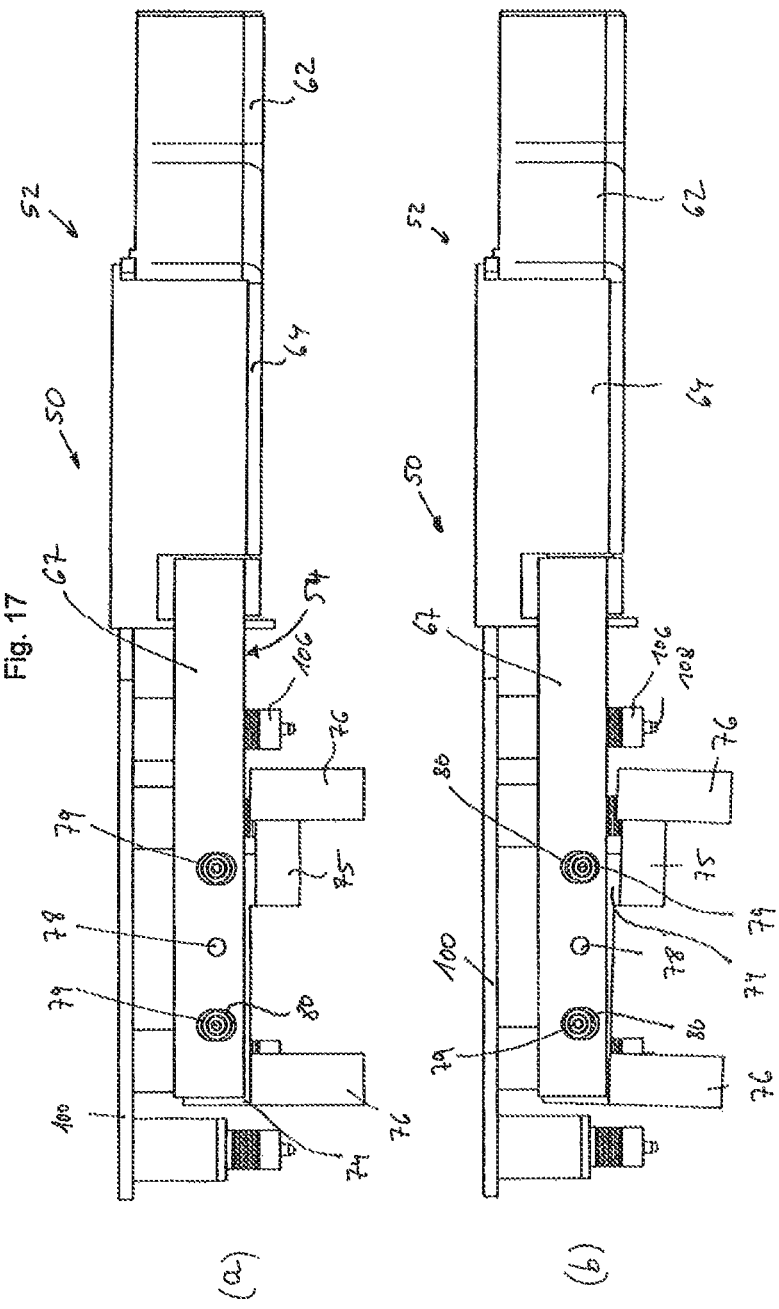
Figure 18:
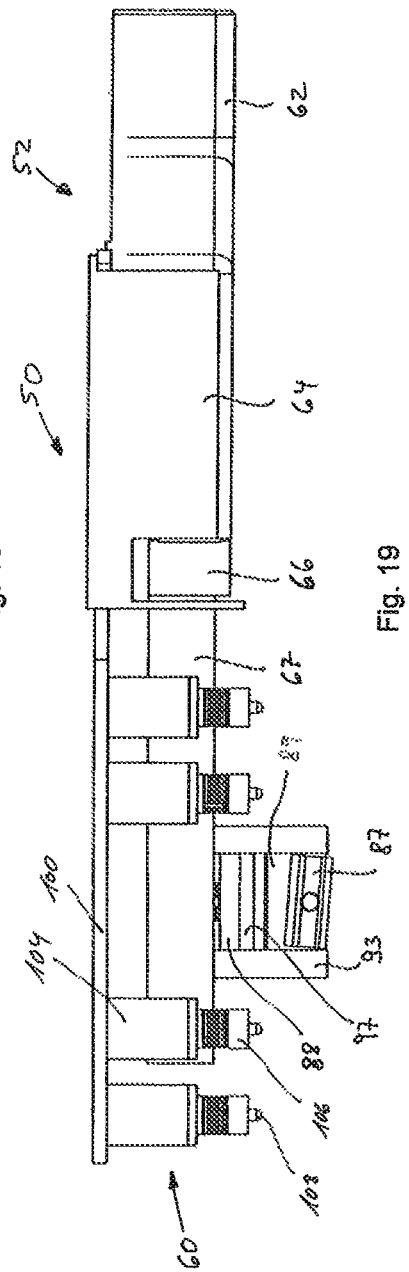
FIG. 18 is a schematic side view similar to FIG. 17, wherein the gripper jaw holder of FIG. 17 has been omitted.
Figure 19:
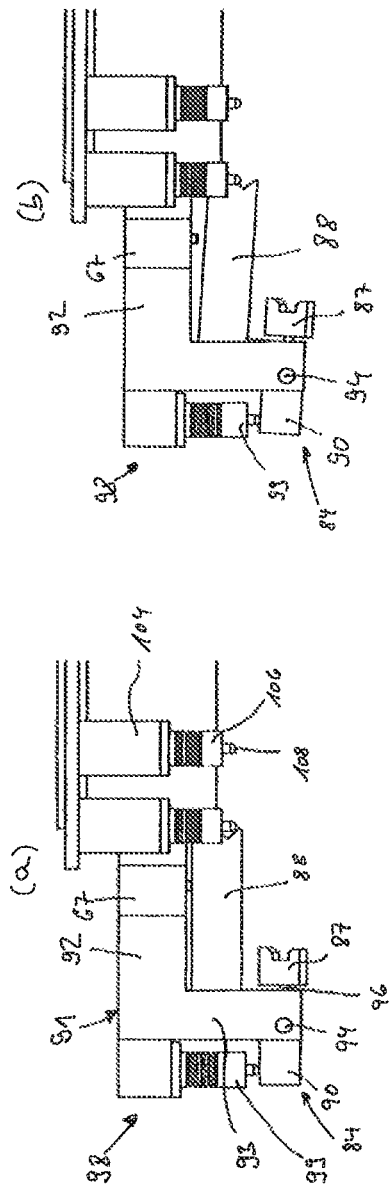

With respect to FIGS. 15 to 19, a specific apparatus 50 for opening and closing the previously described holder 1 may be explained in more detail. FIG. 15 shows a schematic front view of the apparatus 50, FIG. 16 shows a schematic right-hand side view according to FIG. 15, FIG. 17 shows a schematic side view similar to FIG. 16, wherein, parts of the apparatus have been omitted, and FIGS. 19a and 19b show enlarged schematic front views of partial areas of the apparatus 50, showing a gripping jaw of the apparatus in different positions.

The apparatus 50 consists in substance of a main arm 52, a first gripper arm 54, a second gripper arm 55, a first gripper arrangement 56 at the first gripper arm and a second gripper arrangement 57 at the second gripper arm as well as a mask-retention arrangement 60.

The main arm 52 has a first mounting end 62 as well as a second mounting end 64. The first mounting end 62 may be connected in any suitable manner to a moving mechanism, which is capable of moving the main arm 52 three-dimensionally within space. Respective moving mechanisms are well known in the field and are thus not explained in more detail here.

The second mounting end 64 is rigidly connected to the first mounting end 62 and supports the first and second gripper arms 54, 55 as well as the mask retention arrangement 60.

Furthermore, a drive is provided at the second mounting end, which is capable of moving the first and second gripper arms 54, 55 with respect to each other, as will be explained in more detail hereinbelow.

The gripper arms 54, 55 each have in substance an L-shape. A respective first leg 66 of the L-shape, which will also be termed the short leg 66, is received in the second mounting end 64 of the main arm 52 and is guided therein in a respective longitudinal direction thereof. In particular, the respective short legs 66 are arranged in the second mounting end 64 of the main arm 52 such that they are substantially parallel to one another and extend from opposite sides of the second mounting end 64. In particular, the short legs 66 of the gripper arms 54, 55 are aligned with respect to each other and are supported in a manner such that they may be moved towards and away from each other.

Second legs 67, which in the following will also be termed as long legs 67 extend at right angles with respect to the short leg 66 towards the front of the second mounting end 64 such that the long legs 67 of the gripper arms extend beyond a front end of the main arm 52. The two legs 66, 67 of the respective gripper arms 54, 55 extend horizontally. The long legs 67 of the gripper arms 54, 55 extend in substance parallel to each other.

As shown by the double-headed arrows F in FIG. 15, the long legs 67 may be moved towards each other and away from each other via respective movement of the short legs 66, in order to adjust the distance therebetween in a suitable manner. The legs 66, 67 each comprise a rectangular cross-section.

The first gripper arm 54 supports a first gripper arrangement 56 at its long leg 67, while the second gripper arm 55 supports a second gripper arrangement 57 at its long leg 67.

The first gripper arrangement 56 in substance has a gripper jaw 70 having two first grippers 71 as well as at least one second gripper 72.

The gripper jaw 70 has a first mounting leg 74, an extension leg 75 as well as two L-shaped gripper portions 76. The mounting leg 74 has an elongated shape having in substance a rectangular cross-section. The mounting leg 74 is mounted to the long leg 67 of the first gripper arm 54, on the side of the long leg 67 facing towards the second gripper arm 55. In particular, the mounting leg 74 is mounted to the long leg 67 in a rotational manner via an axis of rotation 78. The axis of rotation 78 extends perpendicular to a longitudinal extension of the long leg 67 in a direction towards the second gripper arm 55.

Furthermore, two guide pins 79 are provided on the mounting leg 74 on both sides of the axis of rotation 78. The guide pins are received in long holes of the long leg 67 of the first gripper arm 54, which holes are ranged on opposite sides of the axis of rotation 78. Hereby, rotation of the mounting leg 74 relative to the long leg 67 of gripper arm 54 is limited, as is for example shown in FIG. 16b. The mounting leg 74 is biased via suitable biasing means, which are for example arranged within the long hole 80 and which act on the guide pin 79 or via any other suitably arranged biasing means into an orientation, in which the longitudinal extension of the mounting leg 74 is substantially parallel to the longitudinal extension of the long leg 67 of the first gripper arm 54. Such a respective alignment is for example shown in FIG. 16a.

The extension leg 75 is joined to the bottom of the mounting leg 74 at the end which is closer to the main arm 52 and extends in substance parallel thereto towards the main arm 52. One of the L-shaped gripper parts 76 is mounted to the free end of the extension leg 75, i.e. the end most distant from the mounting leg 74. A respective L-shaped gripper part 76 is also provided on the mounting leg 74 at the end of the mounting leg 74 which is most distant from the main arm 52. The mounting leg 74, the extension leg 75 as well as the L-shaped gripper parts 76 may be integrally formed, but they may also be formed from different elements, which are mounted to each other. Currently, the integral form is preferred.

The L-shaped gripper parts 76 each have a longitudinally extending first leg 82, which extends below and perpendicular to the mounting leg 74, in particular the first leg extends in a horizontal direction an crosses the long leg 67 of the first gripper arm 54 below the same. At the free end of the first leg 82 a second leg 83 extends perpendicularly downward. The first leg 82 has a recess at its end facing to the second gripper arm 55, which acts to form the second gripper 72.

Also in the downwardly extending second leg 83 a recess is formed, which forms the gripping jaw 70 of the first gripper 71. Since two of the L-shaped gripper parts 76 are provided, correspondingly also two first grippers 71 are provided, which are spaced in the longitudinal extension of the mounting leg 74 and thus in the longitudinal direction of the long leg 67 of the first gripper arm 54. The grippers 71 and 72 are formed by recesses in the respective leg portions of the gripper jaw. They may, however, also be formed in a different manner, in particular as separate elements, which may be mounted to the respective leg portions of the gripper jaw.

The second gripper arrangement 57, which is mounted to the second gripper arm 55, is formed in substance by a gripper jaw 84, a first gripper 87 mounted to the gripper jaw 84 and a second gripper 97. The gripper jaw 84 has a first horizontal leg 88, a vertical connecting leg 89 and a second horizontal leg 90. The gripper jaw 84 may again be integrally formed or may be formed of several individual parts.

The first horizontal leg 88 extends perpendicularly below the long leg 67 of the second gripper arm 55. At the lower side of the long leg 67 of the second gripper arm 55 an adjustable stop is provided, against which the upper side of the first horizontal leg 88 may rest, as, for example, shown in the view of FIG. 15. At the end of the first leg 88, which faces towards the first gripper arm 54, the second gripper 97 is formed by means of a recess, in the same manner as the second gripper 72 is formed in the first gripper jaw 70.

At the end of the first horizontal leg 88, which is opposite to the second gripper 97, the vertical connecting leg 89 is provided and extends perpendicularly downward from the respective end. At the lower end of the vertical connecting leg 89 the second horizontal leg 90 is provided which again extends perpendicular to the vertical connecting leg 89.

The second horizontal leg 90 extends in substance parallel to the first horizontal leg 88. The first gripper 87 is supported by the end of the second horizontal leg 90 facing the first gripper arm 54. The first gripper 87 is mounted to be rotatable around an axis of rotation 96 which extends parallel to the second horizontal leg 90. The axis of rotation 96 is directed towards the first gripper arm 54.

The gripper jaw 84 is mounted to the second gripper arm 55 via a mounting bracket 91. In particular, the mounting bracket 91 is mounted to the side of the long leg 67 of the second mounting arm 55 which faces away from the first mounting arm 54. A respective mounting may be performed in any suitable manner. The mounting bracket 91 in substance has an angled shape with a horizontal leg 92 and a vertical leg 93 which extends perpendicularly downward from one end of the horizontal leg 92. At its lower end, the vertical leg 93 of the mounting bracket 91 supports an axis of rotation 94. The axis of rotation 94 extends in substance parallel to the long leg 67 of the second mounting arm 55 in a horizontal direction.

The second horizontal leg 90 of the gripper jaw 84 is mounted in a rotational manner to the mounting bracket 92 via the axis of rotation 94. The mounting bracket 91 is furthermore provided with a biasing unit 98 having a downwardly-biased pin 99, which is biased downwardly in any suitable manner and acts on one end of the second horizontal leg 90. The pin 99 presses onto the second horizontal leg 90 such that it rotates counterclockwise around the axis of rotation as seen in FIG. 15. This rotation is limited by the stop on the first horizontal leg 88 coming into contact with the lower side of the long leg 67 of the second mounting arm 55. In this position, the first horizontal leg 88 and the second horizontal leg 90 of the gripper jaw 84 are horizontally aligned. As indicated in FIG. 19b, however, the gripper jaw may be rotated against the biasing of the pin 99 in a clockwise direction around the axis of rotation 94.

The first and second gripper arrangements 56 and 57 are arranged on the respective first and second gripper arms 54, 55 such that in a home position of the gripper arrangements the grippers 71 and 87 are arranged in a horizontal plane and face each other. Similarly, in a home position of the gripper arrangements, the grippers 72 and 97 are arranged in a horizontal plane and face each other.

Due to the movable arrangement of the first and second gripper jaws 70, 84 relative to the respective gripper arms 54, 55 in combination with the additional rotational arrangement of the gripper 87, adaptation of the respective grippers 87, 71 to an element which is not horizontally aligned is possible. In particular, the grippers 87 and 71 are configured for gripping the handles 37 of a sealing frame 7 of a holder 1 of the above-described type. The grippers 72, 97, however, may be provided for gripping other elements such as a photomask.

The mask-retention arrangement 60 of apparatus 50 in substance comprises a horizontally extending plate element 100 as well as retention arrangements 102 mounted thereon.

One end of the plate element 100 is with mounted to the second mounting end 64 of the main arm 52 such that it extends parallel to the gripper arms 54, 55. The plate element 100 may be rigidly mounted to the mounting end 64 of the main arm 52 but may also be held in a height-adjustable and/or pivotable manner. The plate element 100 may be locked into the position shown in the figures.

The retention arrangements 102 each comprise receiving sleeves 104 as well as retention pins 106, which are movably arranged in the receiving sleeves 104. In particular, four of these retention arrangements 102 are arranged on a lower side of the plate element 100. The receiving sleeves 104 are mounted in a suitable manner to the lower side of the plate element 100 such that a longitudinal axis of the respective receiving sleeve 104 extends perpendicular to the plate element 100.

The receiving sleeves 104 each form a respective receiving space therein (not shown) for receiving the retention pins 106. The retention pins 106 are movably guided in a longitudinal direction of the receiving spaces. A biasing unit (not shown) is provided within the respective receiving spaces of the receiving sleeves 104. The biasing unit biases the retention pins 106 in a direction out of the receiving sleeves 104. Movement of the retention pins 106 out of the receiving sleeves 104 is limited in a suitable manner. A respective biasing unit may, for example, be formed by mechanical springs, pneumatic springs or other elements. While FIG. 15 shows a completely retracted position of the retention pins 106, FIG. 16 shows a completely extended position of the retention pins 106.

The retention pins 106 each comprise a guide portion (not shown), which is received within the receiving sleeve 104, as well as a portion extending from the receiving sleeve 104, which portion supports a contact tip 108 at its lower end. The retention pins 106 may be moved against the biasing force of the biasing units into the receiving sleeves 104 and may be moved out of the receiving sleeves 104, as the skilled person will realize. The contact tips 108 may also be resiliently supported within the retention pins 106 in a similar manner. The portion of the respective retention pins 106, which is located outside the receiving sleeve 104, is received in a jacket, which is mounted to the respective receiving sleeve 104. The jacket forms a type of bellows such that any particles which may be generated while guiding the retention pins 106 in the receiving sleeves are enveloped and may not fall onto a photomask placed there below.

In a working position of the mask-retention arrangement 60, as for example shown in FIG. 16, the plate element 100 is in a position as shown. In this position, the retention pins 106 are positioned between the gripper arms 54, 55 such that when the grippers 87, 71 were to grip the handles 37 on a sealing frame 7, in which no photomask is received, at least one of the contact tips 108 of the retention pins 106 would extend into the centre opening 26 of the sealing frame 7. If, however, a photomask is received within the sealing frame 7, the contact tips 108 would contact the upper side of the photomask 2 and the retention pins 106 would be resiliently moved into the receiving sleeves 104.

In the following, a cleaning process using the previously described holder 1 and the apparatus 50 for opening and closing the holder will be described in more detail. First, a photomask 2 will be placed onto the supports 16 of the support elements 15 such that the side to be protected or the side having a pellicle faces downward. Subsequently, by means of the apparatus 50, the sealing frame 7 will be positioned above the base 5 and then moved towards the base. In so doing, the contact tips of the retention pins 106 will come into contact with the upwardly facing side of the photomask 2 and they will press the photomask against the supports 16. With a further downward movement of the sealing frame towards the base, the retention pins elastically move against the respective bias in the receiving sleeves 104. Furthermore, during this movement of the sealing frame, the circumferential seal 22 on the sealing frame 7 will initially come into contact with the upwardly facing side of the photomask 2. Upon further downward movement of the sealing frame 7, the seal 22 will be deformed upwards. With a continued movement of the sealing frame 7 towards the base 5 a lower side of the seal 22 will come into contact with the side surface of the photomask 2 and will seal against the same. This position of the seal will be maintained until the sealing frame 7 rests on the base 5. The sealing frame 7 will then be fixed towards the base 5, for example by means of negative pressure or vacuum, the apparatus 50 will be released and moved out of the area directly above the holder 1.

At this point in time, the lower side of the photomask 2 or a pellicle on the lower side of the photomask 2 will be sealed with respect to the environment. Now a cleaning medium, such as a cleaning fluid, a gas or a solid material such as frozen $CO_2$ will be applied to the upwardly facing side of the photomask 2 in order to clean the same. Due to the sealing of the photomask 2 at its side surface, the lower side of the photomask 2, or a pellicle attached thereto, will be protected from the cleaning medium.

In the case where a liquid is applied, after the application of the cleaning liquid to the upper side and an optional rinsing thereof with a rinsing liquid, the respective upper side of the photomask 2 may be dried. This may for example be achieved by a quick rotation or spinning of the base 5 and hence the sealing frame 7 and the photomask 2. A respective drying may also be achieved and/or facilitated by means of a gas flow being directed onto the upper side of the photomask 2.

Subsequently, the apparatus 50 is again brought into a position above the sealing frame 7 and the grippers 87 and 71 are brought into engagement with the handles 37 on the sealing frame 7. Upon movement of the apparatus 50 into a respective gripping position, the contact tips 108 of the retaining pins 106 again contact the upper side of the photomask 2 and the retaining pins 106 again elastically move into the receiving sleeves 104. During a subsequent upward movement of the apparatus 50, the retaining pins 106 press the photomask 2 against the supports 16 of the support elements 15, while the sealing frame 7 is lifted via the grippers 87, 71 of the apparatus. Hereby, the stroke of the retention pins 106 as well as the respective biasing thereof is sufficient to securely hold the photomask 2 on the supports 16 of the support elements 15.

When the sealing frame 7 is lifted up and removed, also the photomask 2 may be removed from the support elements 15 of the base 5.

The invention has been described with respect to preferred embodiments herein above without being limited to the specific embodiments. The skilled person will realize different modifications and changes within the scope of the claims.

The invention claimed is:

1. A holder for receiving and for protecting one side of a photomask or a photomask with pellicle from a cleaning medium, the holder comprising:
a base having at least three support elements, which are arranged for receiving and for holding the photomask or the photomask with pellicle spaced from the bottom surface of the base, such that the side to be protected faces the bottom surface of the base;
a sealing frame movable with respect to the base, wherein the sealing frame has an upper side and a lower side, wherein the lower side of the sealing frame is configured to set onto the base, and wherein the sealing frame comprises a centre opening, which is sized such that it may receive the photomask in a spaced manner;
a circumferential, elastic sealing element mounted to the sealing frame, wherein the sealing element extends from the inner circumference of the centre opening into the centre opening such that the circumferential, elastic sealing element is inclined towards the upper side of the sealing frame, wherein the sealing element in a no load condition has an inner circumference, which is smaller than the outer circumference of the photomask, and in a load condition, when a photomask or a photomask with pellicle is received in the centre opening, circumferentially contacts the same at its side surface, and
wherein when the photomask or the photomask with pellicle is received on the support elements of the base and the sealing frame is set onto the base, the lower side of the photomask or the photomask with pellicle is sealed with respect to the environment.

2. The holder of claim 1, wherein the support elements are arranged such that they contact the photomask only at an edge, in particular a lower edge near the corners of the photomask.

3. The holder of claim 1, wherein the support elements each have two inclined support surfaces for contacting the photomask at two different longitudinal edges.

4. The holder of claim 1, wherein the seal in a no load condition extends from the inner circumference of the centre opening in a uniform manner into the same over a distance of 2.5 to 3.5 mm and preferably a distance of about 2.9 mm.

5. The holder of claim 1, wherein the seal is sized such that in an no load condition it overlaps an edge area of a photomask, which is centered with respect to the seal by about 0.4 to 1 mm, preferably by 0.6 to 0.8 mm.

6. The holder of claim 1, wherein the seal has a thickness in the range of 1 and 3 mm, preferably in the range of 1.5 to 2.5 mm and a shore hardness A in the range of 25° to 75°.

7. The holder of claim 1, wherein the seal has a substantially flat configuration in a no load condition and prior to mounting the seal in the sealing frame.

8. The holder of claim 1, wherein the seal has a substantially rectangular inner circumference, wherein the corners of the inner circumference are rounded and preferably have a radius in the range of 2 to 4 mm, in particular of about 3 mm.

9. The holder of claim 1, wherein the seal has a substantially rectangular configuration and has a mounting lug on it outer circumference at at least two opposite edge regions.

10. The holder of claim 1, wherein the seal is resistant to the cleaning medium to be used and/or UV radiation.

11. The holder of claim 1, wherein the sealing frame has an upper part and a lower part, which are attached to each other in a detachable manner, and wherein the seal is clamped between the upper part and the lower part.

12. The holder of claim 11, wherein the upper part and the lower part form a circumferential receiving space for the seal, which is open towards the centre opening, tapers towards the centre opening and extends towards the centre opening in an inclined manner towards the upper side of the sealing frame.

13. The holder of claim 12, wherein the receiving space for the seal is on average inclined by approximately 29° towards the upper side of the sealing frame.

14. The holder of claim 12, wherein the receiving space has a height at its end facing the centre opening, which is smaller than the thickness of the seal.

15. The holder of claim 14, wherein the end of the receiving space, which faces the centre opening has a heights, which is by 10% to 20% smaller than the thickness of the seal.

16. The holder of claim 1, wherein the sealing frame has a slope in an area above the mounting location of the seal, which widens towards the radial circumference of the sealing frame.

17. The holder of claim 1, wherein the base comprises a holder unit, in particular a vacuum or negative pressure unit, for holding the sealing frame in a releasable manner to the base.

18. The holder of claim 1, wherein at least one of the base and the sealing frame comprises a circumferential seal, which faces towards the other element, i.e. the sealing frame or the base.

19. The holder of claim 1, wherein the base and the sealing frame comprise complementary guide elements, which during placement of the sealing frame onto the base achieve alignment of the two elements with respect to each other.

20. A method for cleaning one side of a photomask, in particular of a photomask having a pellicle, comprises the following steps:
receiving the photomask in a holder of claim 1, wherein the photomask is initially placed onto the support elements, such that its side not to be cleaned faces the base, and thereafter the sealing frame is placed onto the base, such that the elastic seal element contacts the photomask circumferentially at its side surface and seals against the same, and such that the side not to be cleaned is sealed with respect to the environment, wherein the side of the photomask to be cleaned is accessible; cleaning the side of the photomask to be cleaned with at least one cleaning medium, which is applied to the side to be cleaned;
removing the sealing frame from the base in the opposite direction to the placement of the sealing frame on the base, while pressing the photomask against the support elements; and
removing the photomask from the support elements.

21. The method of claim 20, wherein the photomask is placed onto the support elements such that only edges, in particular corners of the photomask contact the support elements.

22. The method of claim 20, wherein during placement of the sealing frame onto the base, the sealing element is deformed towards the upper side of the sealing frame, such that the lower side of the sealing element contacts the side surface of the photomask and seals against the same.

23. The method of claim 20, wherein the cleaning medium is a liquid medium and the cleaned side of the photomask is dried prior to removing the sealing frame from the base.

24. The holder of claim 1, wherein the elastic sealing element is fixed to the sealing frame and is configured to deform elastically relative to the sealing frame in response to contact with the photomask when the photomask is inserted into the sealing frame.

25. An apparatus for opening and closing a holder for receiving and for protecting one side of a photomask or a photomask with pellicle from a cleaning medium, the holder comprising:
a base having at least three support elements, which are arranged for receiving and for holding the photomask or the photomask with pellicle spaced from the bottom surface of the base;
a sealing frame having an upper side and a lower side, wherein the lower side maybe set onto the base, and wherein the sealing frame comprises a centre opening, which is sized such that it may receive the photomask in a spaced manner;
a circumferential, elastic sealing element at the sealing frame, which extends from the inner circumference of the centre opening into the centre opening in an inclined manner towards the upper side of the sealing frame, wherein the sealing element in a no load condition has an inner circumference, which is smaller than the outer circumference of the photomask, and in a load condition, may circumferentially contact a photomask, which is received in the centre opening, at its side surface;
wherein the apparatus for opening and closing the holder comprises:
at least two spaced grippers, which face each other, which grippers are movable between an open position, in which they may freely receive the sealing frame therebetween, and a closed position, in which they may grip the sealing frame;
a mask retention unit having at least one retention pin, which is spatially arranged between the grippers, such that it is aligned with the centre opening in the sealing frame, when the sealing frame is received between the grippers, and which extends in substance perpendicular to an opening/closing direction of movement of the grippers, wherein the at least one retention pin is supported to be movable in its direction of extension;
a moving unit, which is coupled to both the gripper and the retention unit, in order to move the same conjointly.

26. The apparatus of claim 25, wherein the at least one retention pin is received within a guide element and is elastically biased out of the guide element via a biasing unit, wherein a movement of the retention pin out of the guide element is limited by means of a stop.

27. The apparatus of claim 25, wherein the at least one retention pin is movable in its direction of extension via a controllable moving mechanism.

28. The apparatus of claim 25, wherein the at least one retention pin is movable from its position between the grippers into a neutral position, in which it cannot perform a retention function.

29. The apparatus of claim 25, wherein the moving unit comprises two spaced arms, which each carry at least one gripper and which at least in the area of the grippers extend substantially parallel in a longitudinal direction thereof.

30. The apparatus of claim 29, wherein the gripper comprises on at least one of the arms a gripper jaw holder having a gripper jaw, wherein the gripper jaw holder is rotationally supported around a first axis of rotation, which extends in a longitudinal direction of the respective arm, and wherein the gripper jaw is mounted on the respective gripper jaw holder to be rotational about a second axis of rotation, which extends perpendicular to the longitudinal extension of the respective arm.

31. The apparatus of claim 30, wherein the first and second axes of rotation are arranged substantially perpendicular to each other.

32. The apparatus of claim 29, wherein the gripper on at least one of the arms comprises a gripper jaw holder having two gripper jaws, which are spaced in a longitudinal direction of the arm supporting the gripper jaw holder, wherein the gripper jaws in a home position are aligned on a line which is substantially parallel to the arm, and wherein the gripper jaw holder is supported to be rotational around a third axis of rotation, which is perpendicular to the longitudinal direction of the respective arm.

33. The apparatus of claim 32, wherein the third axis of rotation points towards the other arm.

34. The apparatus of claim 32, further comprising a biasing unit, which biases the gripper jaw holder to its home position.

* * * * *